(12) United States Patent
Kubo et al.

(10) Patent No.: US 11,120,993 B2
(45) Date of Patent: Sep. 14, 2021

(54) DIFFUSING AGENT COMPOSITION AND METHOD OF MANUFACTURING SEMICONDUCTOR SUBSTRATE

(71) Applicant: TOKYO OHKA KOGYO CO., LTD., Kawasaki (JP)

(72) Inventors: Keisuke Kubo, Kawasaki (JP); Yoshihiro Sawada, Kawasaki (JP); Shunichi Mashita, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 16/877,895

(22) Filed: May 19, 2020

(65) Prior Publication Data

US 2020/0373162 A1 Nov. 26, 2020

(30) Foreign Application Priority Data

May 24, 2019 (JP) .............................. JP2019-098088

(51) Int. Cl.
| | |
|---|---|
| *H01L 21/00* | (2006.01) |
| *H01L 21/22* | (2006.01) |
| *H01L 21/225* | (2006.01) |
| *C08K 5/17* | (2006.01) |
| *C09D 7/63* | (2018.01) |

(52) U.S. Cl.
CPC ............ *H01L 21/2225* (2013.01); *C08K 5/17* (2013.01); *C09D 7/63* (2018.01); *H01L 21/2255* (2013.01)

(58) Field of Classification Search
None
See application file for complete search history.

(56) References Cited

U.S. PATENT DOCUMENTS

| | | | |
|---|---|---|---|
| 2008/0020328 A1* | 1/2008 | Sugeta | ...................... G03F 7/40 430/327 |
| 2017/0278998 A1* | 9/2017 | Yamarin | ............. H01L 31/0201 |
| 2018/0374704 A1* | 12/2018 | Sawada | ............... H01L 21/2225 |

FOREIGN PATENT DOCUMENTS

| | | |
|---|---|---|
| JP | H 06-318559 A | 11/1994 |
| WO | WO 2014/064873 | 5/2014 |

* cited by examiner

*Primary Examiner* — Reema Patel
(74) *Attorney, Agent, or Firm* — Knobbe Martens Olson & Bear LLP

(57) ABSTRACT

A diffusing agent composition that can form a coating film in which the unevenness thereof is lowered, which is uniform and which has excellent stability, and a method of manufacturing a semiconductor substrate in which an impurity diffusing component is diffused into the semiconductor substrate from the coating film formed of the diffusing agent composition. An aliphatic amine which satisfies predetermined conditions is contained as an aliphatic amine compound in a diffusing agent composition including an impurity diffusing component. When the number of primary amino groups included in the amine compound is NA, the number of secondary amino groups included in the compound is NB, and the number of tertiary amino groups included in the amine compound is NC, NA, NB and NC satisfy predetermined formulas.

13 Claims, No Drawings

DIFFUSING AGENT COMPOSITION AND METHOD OF MANUFACTURING SEMICONDUCTOR SUBSTRATE

This application claims priority to Japanese Patent Application No. 2019-098088, filed May 24, 2019, the entire content of which is incorporated herein by reference.

BACKGROUND OF THE INVENTION

Field of the Invention

The present invention relates to a diffusing agent composition which is applied as an impurity diffusing component to the surface of a semiconductor substrate so as to be able to form a diffusion layer and a method of manufacturing a semiconductor substrate in which the impurity diffusing component is diffused into the semiconductor substrate from a thin film formed of the diffusing agent composition.

Related Art

Semiconductor substrates used in semiconductor elements such as a transistor, a diode and a solar battery are manufactured by diffusing, into the semiconductor substrates, impurity diffusing components such as phosphorus and boron. In the semiconductor substrates described above, when a semiconductor substrate for a multi-gate element such as a Fin-FET or a nanowire FET is manufactured, for example, an impurity may be diffused into a semiconductor substrate which has, on its surface, a three-dimensional structure having nanometer-scale minute air gaps.

Here, as a method of diffusing an impurity diffusing component into a semiconductor substrate, for example, an ion implantation method (see, for example, Patent Document 1), a CVD method (see, for example, Patent Document 2) and the like are known. In the ion implantation method, an ionized impurity diffusing component is implanted into the surface of a semiconductor substrate. In the CVD method, an oxide film such as a silicon oxide which is doped with an impurity diffusing component such as phosphorus or boron is formed by CVD on a semiconductor substrate, thereafter the semiconductor substrate having the oxide film is heated with an electric furnace or the like and thus the impurity diffusing component is diffused from the oxide film into the semiconductor substrate.
Patent Document 1: Japanese Unexamined Patent Application, Publication No. H06-318559
Patent Document 2: PCT International Publication No. WO2014/064873

SUMMARY OF THE INVENTION

However, in the ion implantation method as disclosed in Patent Document 1, when ions are implanted into the semiconductor substrate, depending on the type of ions, a point defect, a point defect cluster or the like may be formed in a region around the surface of the substrate. For example, when the impurity diffusing component is diffused into the semiconductor substrate by the ion implantation method so as to form a CMOS element such as a CMOS image sensor, the occurrence of such a defect directly causes the function of the element to be lowered.

When a semiconductor substrate has, on its surface, for example, a nanoscale three-dimensional structure such as a three-dimensional structure for forming a multi-gate element called a Fin-FET which includes the fins of a plurality of sources, the fins of a plurality of drains and a gate orthogonal to those fins, in the ion implantation method, it is difficult to uniformly implant ions into the side surfaces and the upper surfaces of the fins, the gates and the like and the entire inner surfaces of concave portions surrounded by the fins and the gates.

When an impurity diffusing component is diffused into a semiconductor substrate having a nanoscale three-dimensional structure by the ion implantation method, even if ions have been uniformly implanted, there may be a failure as described below. For example, when a logic LSI device or the like is formed with a semiconductor substrate having a three-dimensional pattern including fine fins, the crystal of a substrate material such as silicon is easily destroyed by the ion implantation. It is considered that the damage of the crystal described above causes a failure such as variations in the property of the device or the generation of a standby leak current.

Disadvantageously, when the CVD method as disclosed in Patent Document 2 is applied, by an overhang phenomenon, it may be difficult to coat the entire inner surfaces of concave portions surrounded by fins and gates with the oxide film in which the film thickness is uniform and which includes the impurity diffusing component or an opening portion may be blocked with the oxide deposited on the opening portion of the concave portion surrounded by the fins and the gates. As described above, in the ion implantation method, the CVD method and the like, depending on the shape of the surface of the semiconductor substrate, it is difficult to satisfactorily and uniformly diffuse the impurity diffusing component into the semiconductor substrate.

In order to solve the problems described above, it is considered to use a coating type diffusing agent composition. When in a substrate having, on its surface, a three-dimensional structure including nanoscale minute air gaps, the coating type diffusing agent composition can be uniformly applied to the entire surfaces including the entire inner surfaces of the minute air gaps, in the semiconductor substrate having the three-dimensional surface described above, an impurity can be uniformly diffused. However, when a diffusing agent composition is applied on a nanoscale three-dimensional structure, it is necessary to reduce the film thickness of a coating film formed of the diffusing agent composition. However, when an extremely thin coating film is formed of the coating type diffusing agent composition, it is likely that it is difficult to form a uniform coating film in which the unevenness of the film thickness or the like is lowered or that the stability of the formed coating film is lowered.

The present invention is made in view of the foregoing problems, and an object thereof is to provide: a diffusing agent composition that can form a coating film in which the unevenness thereof is lowered, which is uniform and which is excellent in stability after being formed; and a method of manufacturing a semiconductor substrate in which an impurity diffusing component is diffused into the semiconductor substrate from the coating film formed of the diffusing agent composition.

The present inventors have found that an aliphatic amine which satisfies predetermined conditions is contained as an amine compound (B) in a diffusing agent composition including an impurity diffusing component (A) and that thus the problems described above can be solved, and thereby have completed the present invention. More specifically, the present invention provides the followings.

A first aspect of the present invention is a diffusing agent composition which is used for diffusion of an impurity into a semiconductor substrate, includes: an impurity diffusing component (A) and an amine compound (B), the amine compound (B) is an aliphatic amine, when the number of primary amino groups included in the amine compound (B) is NA, the number of secondary amino groups included in the amine compound (B) is NB and the number of tertiary amino groups included in the amine compound (B) is NC, NA, NB and NC satisfy formulas (1) and (2) below:

$$(NB+NC) \geq 1 \quad (1); \text{ and}$$

$$(NA+NB+NC) \geq 2 \quad (2); \text{ and}$$

when NB+NC<NA, in the amine compound (B), the primary amino groups are bound to an aliphatic hydrocarbon group having 2 or less carbon atoms.

A second aspect of the present invention is a method of manufacturing a semiconductor substrate, and the method includes: forming a coating film by applying the diffusing agent composition according to the first aspect on the semiconductor substrate; and diffusing the impurity diffusing component (A) in the diffusing agent composition into the semiconductor substrate.

According to the present invention, it is possible to provide: a diffusing agent composition that can form a coating film in which the unevenness thereof is lowered, which is uniform and which is excellent in stability after being formed; and a method of manufacturing a semiconductor substrate in which an impurity diffusing component is diffused into the semiconductor substrate from the coating film formed of the diffusing agent composition.

DETAILED DESCRIPTION OF THE INVENTION

<<Diffusing Agent Composition>>

A diffusing agent composition is a diffusing agent composition which is used for diffusion of an impurity into a semiconductor substrate, and includes an impurity diffusing component (A). The impurity diffusing component (A) is applied to the surface of the semiconductor substrate so as to be able to form a diffusion layer.

The diffusing agent composition includes, together with the impurity diffusing component (A), an amine compound (B) which is an aliphatic amine. The amine compound (B) described above satisfies predetermined conditions which will be described later. The amine compound (B) as described above is contained in the diffusing agent composition together with the impurity diffusing component (A), and thus a coating film in which the unevenness thereof is lowered, which is uniform and which is excellent in stability after being formed can be formed of the impurity diffusing agent composition.

Essential or arbitrary components included in the diffusing agent composition will be described below.

[Impurity Diffusing Component (A)]

The impurity diffusing component (A) is not particularly limited as long as the impurity diffusing component (A) is a component which is conventionally used for doping of a semiconductor substrate, and may be an n-type dopant or a p-type dopant. Examples of the n-type dopant include simple substances such as phosphorus, arsenic and antimony and compounds including these elements. Examples of the p-type dopant include simple substances such as boron, gallium, indium and aluminum and compounds including these elements.

As the impurity diffusing component (A), a phosphorus compound, a boron compound or an arsenic compound is preferable because they are easily available and are easy to handle. Examples of the phosphorus compound include phosphoric acid, phosphorous acid, diphosphorous acid, polyphosphoric acid, diphosphorus pentoxide, phosphite esters, phosphate esters, tris phosphite (trialkylsilyl), tris phosphate (trialkylsilyl) and the like. Examples of the boron compound include boric acid, metaboric acid, boronic acid, perboric acid, hypoboric acid, diboron trioxide, trialkyl borate, tetrahydroxydiborane, monoalkoxytrihydroxydiborane, dialkoxydihydroxydiborane, trialkoxymonohydroxydiborane and tetra alkoxydiborane. Examples of the arsenic compound include arsenic acid and trialkyl arsenate.

As the phosphorus compound, phosphite esters, phosphate esters, tris phosphite (trialkylsilyl) and tris phosphate (trialkylsilyl) are preferably, among them, trimethyl phosphate, triethyl phosphate, trimethyl phosphite, triethyl phosphite, tris phosphate (trimethylsilyl) and tris phosphite (trimethylsilyl) are preferable, trimethyl phosphate, trimethyl phosphite and tris phosphate (trimethylsilyl) are more preferable and trimethyl phosphate is particularly preferable.

As the boron compound, boric acid, trimethoxyboron, triethoxyboron, tri-n-propoxyboron, triisopropoxyboron, tri-n-butoxyboron, trimethylboron, triethylboron and tetrahydroxydiborane are preferable.

As the arsenic compound, arsenic acid, triethoxy arsenic and tri-n-butoxy arsenic are preferable.

The content of the impurity diffusing component (A) in the diffusing agent composition is not particularly limited. The content of the impurity diffusing component (A) in the diffusing agent composition is preferably 0.01% by mass or more and 20% by mass or less, is more preferably 0.02% by mass or more and 5% by mass or less and is particularly preferably 0.03% by mass or more and 1% by mass or less.

[Amine Compound (B)]

The diffusing agent composition contains the amine compound (B). The amine compound (B) is an aliphatic amine. Here, it is assumed that an amine compound which does not include an aromatic group is the aliphatic amine. In the amine compound (B), when the number of primary amino groups included in the amine compound (B) is NA, the number of secondary amino groups included in the amine compound (B) is NB and the number of tertiary amino groups included in the amine compound (B) is NC, NA, NB and NC satisfy formulas (1) and (2) below:

$$(NB+NC) \geq 1 \quad (1); \text{ and}$$

$$(NA+NB+NC) \geq 2 \quad (2).$$

The diffusing agent composition includes, together with the impurity diffusing component (A), the amine compound (B) which satisfies the predetermined conditions described above, and thus it is possible to use the diffusing agent composition so as to form a thin film which is excellent in temporal stability.

When NB+NC<NA, in the amine compound (B), the primary amino groups are bound to an aliphatic hydrocarbon group having 2 or less carbon atoms. When a primary amino group having a low steric hindrance is bound to a relatively long chain aliphatic hydrocarbon group, the three-dimensional flexibility of the primary amino group is high. When NB+NC<NA, the amine compound includes two or more primary amino groups. Although the detailed reason is unclear, it is considered that the conditions described above are satisfied in the primary amino groups, and that thus the number of primary amino groups having high three-dimensional flexibility is limited so as to enhance the formation of the film and the stability of the film.

The amine compound (B) may be a linear or branched aliphatic amine or may be an aliphatic amine having a cyclic skeleton. Since the desired effect produced by use of the amine compound (B) is easily obtained, the amine compound (B) is preferably a linear or branched aliphatic amine compound.

The amine compound (B) may include a carbon-carbon unsaturated bond. In terms of, for example, the stability of the diffusing agent composition, the amine compound (B) preferably does not include a carbon-carbon unsaturated bond.

As the amine compound (B), an amine compound is preferable which satisfies the conditions described above on NA, NB and NC and which is represented by formula (B1) below.

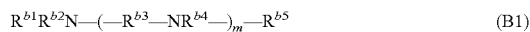

In formula (B1), $R^{b1}$, $R^{b2}$, $R^{b4}$ and $R^{b5}$ each independently represent a hydrogen atom, an alkyl group having 1 or more and 6 or less carbon atoms or a hydroxyalkyl group having 1 or more and 6 or less carbon atoms. $R^{b3}$ represents an alkylene group having 1 or more and 6 or less carbon atoms. Here, m represents an integer of 1 or more and 5 or less, and m preferably represents an integer of 1 or more and 3 or less. When m represents an integer of 2 or more and 5 or less, a plurality of $R^{b3}$s may be identical or different, and a plurality of $R^{b4}$s may be identical or different. In formula (B1), any two groups selected from a group consisting of $R^{b1}$, $R^{b2}$, $R^{b4}$ and $R^{b5}$ may be bound to form a ring. The amine compound represented by formula (B1) may include two rings.

The number of carbon atoms in the alkyl group serving as $R^{b1}$, $R^{b2}$, $R^{b4}$ and $R^{b5}$ is 1 or more and 6 or less, and is preferably 1 or more and 4 or less. Specific examples of the alkyl group serving as $R^{b1}$, $R^{b2}$, $R^{b4}$ and $R^{b5}$ include a methyl group, an ethyl group, an n-propyl group, an isopropyl group, an n-butyl group, an isobutyl group, a sec-butyl group, a tert-butyl group, an n-pentyl group and an n-hexyl group. Among them, a methyl group, an ethyl group, an n-propyl group, an isopropyl group, an n-butyl group, an isobutyl group, a sec-butyl group and a tert-butyl group are preferable.

The number of carbon atoms in the hydroxyalkyl group serving as $R^{b1}$, $R^{b2}$, $R^{b4}$ and $R^{b5}$ is 1 or more and 6 or less, and is preferably 1 or more and 4 or less. Specific examples of the hydroxyalkyl group serving as $R^{b1}$, $R^{b2}$, $R^{b4}$ and $R^{b5}$ include a hydroxymethyl group (methylol group), a 2-hydroxyethyl group, a 3-hydroxy-n-propyl group, a 4-hydroxy-n-butyl group, a 5-hydroxy-n-pentyl group and a 6-hydroxy-n-hexyl group. Among them, a 2-hydroxyethyl group and a 3-hydroxy-n-propyl group are preferable.

The number of carbon atoms in the alkylene group serving as $R^{b3}$ is 1 or more and 6 or less, and is preferably 1 or more and 4 or less. Specific examples of the alkylene group serving as $R^{b3}$ include a methylene group, an ethane-1,2-diyl group, an ethane-1,1-diyl group, a propane-1,3-diyl group, a propane-1,2-diyl group, a propane-1,1-diyl group, a butane-1,4-diyl group, a pentane-1,5-diyl group and a hexane-1,6-diyl group. Among them, a methylene group, an ethane-1,2-diyl group and a propane-1,3-diyl group are preferable.

Specific preferred examples of the amine compound (B) include: N-alkylalkanediamines such as N-methylethylenediamine, N-ethylethylenediamine, N-n-propylethylenediamine, N-isopropylethylenediamine, N-n-butylethylenediamine, N-isobutylethylenediamine, N-sec-butylethylenediamine, N-tert-butylethylenediamine, N-methyl-1,3-propanediamine, N-ethyl-1,3-propanediamine, N-n-propyl-1,3-propanediamine, N-isopropyl-1,3-propanediamine, N-n-butyl-1,3-propanediamine, N-isobutyl-1,3-propanediamine, N-sec-butyl-1,3-propanediamine and N-tert-butyl-1,3-propanediamine; N, N-dialkylalkanediamines such as N, N-dimethylethylenediamine, N, N-diethylethylenediamine, N, N-di-n-propylethylenediamine, N, N-diisopropylethylenediamine, N, N-di-n-butylethylenediamine, N, N-diisobutylethylenediamine, N, N-di-sec-butylethylenediamine, N, N-di-tert-butylethylenediamine, N, N-dimethyl-1,3-propanediamine, N, N-diethyl-1,3-propanediamine, N, N-di-n-propyl-1,3-propanediamine, N, N-diisopropyl-1,3-propanediamine, N, N-di-n-butyl-1,3-propanediamine, N, N-diisobutyl-1,3-propanediamine, N, N-di-sec-butyl-1,3-propanediamine and N, N-di-tert-butyl-1,3-propanediamine; N, N'-dialkylalkanediamines such as N, N'-dimethylethylenediamine, N, N'-diethylethylenediamine, N, N'-di-n-propylethylenediamine, N,N'-diisopropylethylenediamine, N, N'-di-n-butylethylenediamine, N, N'-diisobutylethylenediamine, N, N'-di-sec-butylethylenediamine, N, N'-di-tert-butylethylenediamine, N, N'-dimethyl-1,3-propanediamine, N, N'-diethyl-1,3-propanediamine, N, N'-di-n-propyl-1,3-propanediamine, N, N'-diisopropyl-1,3-propanediamine, N, N'-di-n-butyl-1,3-propanediamine, N, N'-diisobutyl-1,3-propanediamine, N, N'-di-sec-butyl-1,3-propanediamine and N, N'-di-tert-butyl-1,3-propanediamine; aliphatic amines having 3 or more nitrogen atoms such as diethylenetriamine, triethylenetetramine, tetraethylenepentamine, 3,3-diaminodipropylamine, N, N'-bis (3-aminopropyl) ethylenediamine, N, N'-bis (3-aminopropyl)-1,3-propanediamine, tris (2-aminoethyl) amine, tris (3-aminopropyl) amine, N-(2-aminoethyl) piperazine and N-(3-aminopropyl) piperazine; hydroxyalkylamines such as N-(2-aminoethyl) ethanolamine, N, N-bis (2-aminoethyl) ethanolamine, N, N-bis (2-hydroxyethyl) ethylenediamine, N-(3-aminopropyl) ethanolamine, N N, N-bis (3-aminopropyl) ethanolamine and N, N-bis (2-hydroxyethyl)-1,3-propanediamine; and aliphatic diamines having a cyclic skeleton such as piperazine, N-methylpiperazine and N-ethylpiperazine.

One type of amine compound (B) may be used singly or two or more types of amine compounds (B) may be combined so as to be used.

The content of the amine compound (B) in the diffusing agent composition is not particularly limited as long as the desired effect produced by use of the amine compound (B) is obtained. The content of the amine compound (B) in the diffusing agent composition is preferably 0.01% by mass or more and 20% by mass or less, is more preferably 0.02% by mass or more and 5% by mass or less and is particularly preferably 0.03% by mass or more and 1% by mass or less. When the amount of amine compound (B) within the above range is used, the unevenness of the film caused by the generation of particles or the like and the deterioration of quality of the film caused by the precipitation of the amine are easily reduced.

[Hydrolyzable Silane Compound (C)]

The diffusing agent composition may contain a hydrolyzable silane compound (C). In a case where the diffusing agent composition contains the hydrolyzable silane compound (C), when the diffusing agent composition is applied to the semiconductor substrate so as to form a thin film, the hydrolyzable silane compound is hydrolyzed so as to be condensed, and thus an extremely thin film of a silicon oxide is formed within a coating film. When an extremely thin film of a silicon oxide is formed within a coating film, the external diffusion of the impurity diffusing component (A)

described above to the outside of the substrate is reduced, and thus even when the film formed of the diffusing agent composition is a thin film, it is easy to satisfactorily and uniformly diffuse the impurity diffusing component (A) into the semiconductor substrate.

The hydrolyzable silane compound (C) includes a functional group which generates a hydroxyl group by hydrolysis and which is bound to an Si atom. Examples of the functional group which generates a hydroxyl group by hydrolysis include an alkoxy group, an isocyanate group, a dimethylamino group, a halogen atom and the like. As the alkoxy group, a linear or branched aliphatic alkoxy group having 1 or more and 5 or less carbon atoms is preferable. Specific preferred examples of the alkoxy group include a methoxy group, an ethoxy group, an n-propoxy group, an isopropoxy group, an n-butoxy group and the like. As the halogen atom, a chlorine atom, a fluorine atom, a bromine atom and an iodine atom are preferable, and a chlorine atom is more preferable.

As the functional group which generates a hydroxyl group by hydrolysis, in terms of ease of being hydrolyzed rapidly, the handleability of the hydrolyzable silane compound (C), ease of availability and the like, an isocyanate group and a linear or branched aliphatic alkoxy group having 1 or more and 5 or less carbon atoms are preferable, and a methoxy group, an ethoxy group and an isocyanate group are more preferable.

Specific examples of the hydrolyzable silane compound (C) including a linear or branched aliphatic alkoxy group having 1 or more and 5 or less carbon atoms include tetramethoxysilane, tetraethoxysilane, tetra-n-propoxysilane, tetraisopropoxysilane, tetra-n-butoxysilane, tetra-n-pentyloxysilane, trimethoxymonoethoxysilane, dimethoxydiethoxysilane, monomethoxytriethoxysilane, trimethoxymono-n-propoxysilane, dimethoxydi-n-propoxysilane, monomethoxytri-n-propoxysilane, trimethoxymono-n-butoxysilane, dimethoxydi-n-butoxysilane, monomethoxytri-n-tributoxysilane, trimethoxymono-n-pentyloxysilane, dimethoxydi-n-pentyloxysilane, monomethoxytri-n-pentyloxysilane, triethoxymono-n-propoxysilane, diethoxydi-n-propoxysilane, monoethoxytri-n-propoxysilane, triethoxymono-n-butoxysilane, diethoxydi-n-butoxysilane, monoethoxytri-n-butoxysilane, triethoxymono-n-pentyloxysilane, diethoxydi-n-pentyloxysilane, monoethoxytri-n-pentyloxysilane, tri-n-propoxymono-n-butoxysilane, di-n-propoxydi-n-butoxysilane, mono-n-propoxytri-n-propoxysilane, tri-n-propoxymono-n-pentyloxysilane, di-n-propoxydi-n-pentyloxysilane, mono-n-propoxytri-n-pentyloxysilane, tri-n-butoxymono-n-pentyloxysilane, di-n-butoxydi-n-pentyloxysilane, mono-n-butoxytri-n-pentyloxysilane, methyltrimethoxysilane, methyltriethoxysilane, methyltri-n-propoxysilane, methyltri-n-propoxysilane, methyltri-n-butoxysilane, methyltri-n-pentyloxysilane, ethyltrimethoxysilane, ethyltriethoxysilane, ethyltri-n-propoxysilane, ethyltri-n-butoxysilane and ethyltri-n-pentyloxysilane. Among these hydrolyzable silane compounds (C), one type may be used singly or two or more types may be combined so as to be used. The condensates obtained by partially hydrolyzing the alkoxysilane compounds described above can also be used as the hydrolyzable silane compound (C).

Among them, tetramethoxysilane, tetraethoxysilane, methyltrimethoxysilane, methyltriethoxysilane, ethyltrimethoxysilane and ethyltriethoxysilane are preferable, and tetramethoxysilane and tetraethoxysilane are particularly preferable.

As the hydrolyzable silane compound (C) including an isocyanate group, a compound represented by formula (c1) below is preferable.

$$(R^{c1})_{4-n}Si(NCO)_n \quad (c1)$$

(In formula (c1), $R^{c1}$ represents a hydrocarbon group, and n represents an integer of 3 or 4.)

The hydrocarbon group serving as $R^{c1}$ in formula (c1) is not particularly limited as long as the object of the present invention is not inhibited. As $R^{c1}$, an aliphatic hydrocarbon group having 1 or more and 12 or less carbon atoms, an aromatic hydrocarbon group having 6 or more and 12 or less carbon atoms and an aralkyl group having 7 or more and 12 or less carbon atoms are preferable.

Preferred examples of the aliphatic hydrocarbon group having 1 or more and 12 or less carbon atoms include a methyl group, an ethyl group, an n-propyl group, an isopropyl group, an n-butyl group, a sec-butyl group, an isobutyl group, a tert-butyl group, an n-pentyl group, an isopentyl group, a neopentyl group, a cyclopentyl group, an n-hexyl group, a cyclohexyl group, an n-heptyl group, a cycloheptyl group, an n-octyl group, a cyclooctyl group, an n-nonyl group, an n-decyl group, an n-undecyl group and an n-dodecyl group.

Preferred examples of the aromatic hydrocarbon group having 6 or more and 12 or less carbon atoms include a phenyl group, a 2-methylphenyl group, a 3-methylphenyl group, a 4-methylphenyl group, a 2-ethylphenyl group, a 3-ethylphenylgroup, a 4-ethylphenyl group, an α-naphthyl group, a β-naphthyl group and a biphenylyl group.

Preferred examples of the aralkyl group having 7 or more and 12 or less carbon atoms include a benzyl group, a phenethyl group, an α-naphthylmethyl group, a β-naphthylmethyl group, a 2-α-naphthylethyl group and a 2-β-naphthylethyl group.

Among the hydrocarbon groups described above, a methyl group and an ethyl group are preferable, and a methyl group is more preferable.

Among the hydrolyzable silane compounds (C) represented by formula (b1), tetraisocyanatesilane, methyltriisocyanatesilane and ethyltriisocyanatesilane are preferable, and tetraisocyanatesilane is more preferable.

The hydrolyzable silane compound (C) including an isocyanate group and the hydrolyzable silane compound (C) including a linear or branched aliphatic alkoxy group having 1 or more and 5 or less carbon atoms can be used together. In this case, a ratio X/Y of the number X of moles of the hydrolyzable silane compound (C) including an isocyanate group to the number Y of moles of the hydrolyzable silane compound (C) including a linear or branched aliphatic alkoxy group having 1 or more and 5 or less carbon atoms is preferably 1/99 to 99/1, is more preferably 50/50 to 95/5 and is particularly preferably 60/40 to 90/10.

Although the content of the hydrolyzable silane compound (C) in the diffusing agent composition when the diffusing agent composition includes the hydrolyzable silane compound (C) is not particularly limited, the concentration of Si is preferably 0.001% by mass or more and 3.0% by mass or less, and is more preferably 0.01% by mass or more and 1.0% by mass or less. The diffusing agent composition contains the hydrolyzable silane compound (C) in the concentration range described above, and thus it is easy to satisfactorily reduce the external diffusion of the impurity diffusing component (A) from a thin coating film formed of the diffusing agent composition, with the result that it is easy to satisfactorily and uniformly diffuse the impurity diffusing component (A) into the semiconductor substrate.

[Organic Solvent (S)]

The diffusing agent composition normally includes an organic solvent (S) as a solvent so as to be able to form a thin coating film. The type of organic solvent (S) is not particularly limited as long as the object of the present invention is not inhibited.

Preferably, when the diffusing agent composition includes the hydrolyzable silane compound (B), the diffusing agent composition substantially does not include water. That the diffusing agent composition substantially does not include water means that the diffusing agent composition does not contain such an amount of water as to hydrolyze the hydrolyzable silane compound (B) and thus to prevent the acquisition of the desired effect produced by the addition thereof.

Specific examples of the organic solvent (S) include: glycol monoethers such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monophenyl ether, dipropylene glycol monomethyl ether, dipropylene glycol monoethyl ether, dipropylene glycol monopropyl ether, dipropylene glycol monobutyl ether, dipropylene glycol monophenyl ether, triethylene glycol monomethyl ether, triethylene glycol monoethyl ether, tripropylene glycol monomethyl ether and tripropylene glycol monoethyl ether; monoethers such as diisopentyl ether, diisobutyl ether, benzyl methyl ether, benzyl ethyl ether, dioxane, tetrahydrofuran, anisole, perfluoro-2-butyltetrahydrofuran and perfluorotetrahydrofuran; glycol chain diethers such as ethylene glycol dimethyl ether, ethylene glycol diethyl ether, ethylene glycol dipropyl ether, ethylene glycol dibutyl ether, propylene glycol dimethyl ether, propylene glycol diethyl ether, propylene glycol dipropyl ether, propylene glycol dibutyl ether, diethylene glycol dimethyl ether, diethylene glycol diethyl ether, diethylene glycol dipropyl ether, diethylene glycol dibutyl ether, dipropylene glycol dimethyl ether, dipropylene glycol diethyl ether, dipropylene glycol dipropyl ether and dipropylene glycol dibutyl ether; cyclic diethers such as 1,4-dioxane; ketones such as 1-octanone, 2-octanone, 1-nonanone, 2-nonanone, acetone, 2-heptanone, 4-heptanone, 1-hexanone, 2-hexanone, 3-pentanone, diisobutylketone, cyclohexanone, methylcyclohexanone, phenylacetone, methylethylketone, methyl isobutyl ketone, ethyl isobutyl ketone, acetylacetone, acetonylacetone, ionone, diacetonyl alcohol, acetylcarbinol, acetophenone, methylnaphthylketone and isophorone; esters such as methyl acetate, butyl acetate, ethyl acetate, isopropyl acetate, pentyl acetate, isopentyl acetate, methoxyethyl acetate, ethyl ethoxy acetate, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, propylene glycol monomethyl ether acetate, propylene glycol monoethyl ether acetate, propylene glycol monopropyl ether acetate, propylene glycol monobutyl ether acetate, propylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-3-methoxypropionate, ethyl-3-methoxypropionate, ethyl-3-ethoxypropionate, propyl-3-methoxypropionate, isopropyl-3-methoxypropionate, propylene carbonate and γ-butyrolactone; amide solvents free of active hydrogen atoms such as N-methyl-2-pyrrolidone, N, N-dimethylacetamide, N, N-dimethylformamide, hexamethylphosphoric triamide and 1,3-dimethyl-2-imidazolidinone; sulfoxides such as dimethyl sulfoxide; aliphatic hydrocarbon solvents which may include halogens such as pentane, hexane, octane, decane, 2,2,4-trimethylpentane, 2,2,3-trimethylhexane, perfluorohexane, perfluoroheptane, limonene and pinene; aromatic hydrocarbon solvents such as benzene, toluene, xylene, ethylbenzene, propylbenzene, 1-methylpropylbenzene, 2-methylpropylbenzene, diethylbenzene, ethylmethylbenzene, trimethylbenzene, ethyldimethylbenzene and dipropylbenzene; monohydric alcohols such as methanol, ethanol, n-propanol, isopropanol, butanol, isobutanol, 2-methoxyethanol, 2-ethoxyethanol, 3-methyl-3-methoxybutanol, hexanol, cyclohexanol, benzyl alcohol and 2-phenoxyethanol; and glycols such as ethylene glycol, propylene glycol, diethylene glycol and dipropylene glycol. In the preferred examples of the organic solvent (S) described above, organic solvents including an ether bond and an ester bond are classified into esters. Among them, one type may be used singly or two or more types may be combined so as to be used.

When the diffusing agent composition includes the hydrolyzable silane compound (C), the organic solvent (S) which does not have a functional group reacting with the hydrolyzable silane compound (C) is preferably used. In particular, when the hydrolyzable silane compound (C) includes an isocyanate group, the organic solvent (S) which does not have a functional group reacting with the hydrolyzable silane compound (C) is preferably used.

The functional group reacting with the hydrolyzable silane compound (C) includes both a functional group which directly reacts with a group capable of generating a hydroxyl group by hydrolysis and a functional group which reacts with a hydroxyl group (silanol group) generated by hydrolysis. Examples of the functional group reacting with the hydrolyzable silane compound (C) include a hydroxyl group, a carboxy group, an amino group, a halogen atom and the like.

As preferred examples of the organic solvent which does not have a functional group reacting with the hydrolyzable silane compound (C), among the specific examples of the organic solvent (S) described above, the organic solvents listed as the specific examples of monoethers, chain diethers, cyclic diethers, ketones, esters, amide solvents free of active hydrogen atoms, sulfoxides, aliphatic hydrocarbon solvents which may include halogens and aromatic hydrocarbon solvents are mentioned.

[Other Components]

The diffusing agent composition may include various additives such as a surfactant, a defoamer, a pH adjuster and a viscosity adjuster as long as the object of the present invention is not inhibited. In order to improve the coating or the film formation, the diffusing agent composition may include a binder resin. As the binder resin, various resins can be used, and an acrylic resin is preferable.

Predetermined amounts of the components described above are uniformly mixed, and thus the diffusing agent composition can be obtained.

<<Method of Manufacturing Semiconductor Substrate>>

A method of manufacturing the semiconductor substrate preferably includes: forming a coating film by applying the diffusing agent composition described above on the semiconductor substrate; and diffusing the impurity diffusing component (A) in the diffusing agent composition into the semiconductor substrate. In the following description, the formation of the coating film is also referred to as a "coating step", and the diffusion of the impurity diffusing component (A) into the semiconductor substrate is also referred to as a "diffusion step". A pre-diffusion heating processing step of processing the semiconductor substrate including the coating film under a temperature condition lower than a diffusion temperature for a predetermined time may be performed between the coating step and the diffusion step.

<Coating Step>

In the coating step, the diffusing agent composition described above is applied on the semiconductor substrate so as to form the coating film. The method of applying the diffusing agent composition is not particularly limited as long as the coating film having a desired film thickness can be formed. As the method of applying the diffusing agent composition, a spin coat method, an inkjet method and a spray method are preferable, and the spin coat method is particularly preferable.

The film thickness of the coating film formed of the diffusing agent composition is not particularly limited. The film thickness of the coating film is preferably 0.5 nm or more and 30 nm or less, is more preferably 0.8 nm or more and 20 nm or less and is further preferably 1 nm or more and 10 nm or less. The film thickness of the coating film is the average value of film thicknesses of five or more points measured with an ellipsometer.

As the semiconductor substrate into which the impurity diffusing component (A) is diffused, various substrates that are conventionally used as targets into which an impurity diffusing component is diffused can be used without particular limitation. As the semiconductor substrate, a silicon substrate is typically used. Depending on the type of impurity diffusing component (A) included in the diffusing agent composition, the silicon substrate is selected as necessary from an n-type silicon substrate and a p-type silicon substrate. The semiconductor substrate such as the silicon substrate often includes a natural oxide film which is formed by natural oxidation of its surface. For example, the silicon substrate often includes a natural oxide film which is mainly formed of $SiO_2$. When the impurity diffusing component (A) is diffused into the semiconductor substrate, as necessary, an aqueous solution of hydrofluoric acid or the like is used so as to remove the natural oxide film on the surface of the semiconductor substrate.

The semiconductor substrate may have, on the surface to which the diffusing agent composition is applied, a three-dimensional structure including a convex portion and a concave portion. When the diffusing agent composition described above is used, even if the semiconductor substrate has such a three-dimensional structure, in particular, the semiconductor substrate has, on its surface, a three-dimensional structure including a nanoscale minute pattern, it is easy to uniformly form, for example, a thin coating film of 30 nm or less on the three-dimensional structure of the semiconductor substrate.

Although the shape of the pattern is not particularly limited, typical examples include a line in which a cross-sectional shape is rectangular and which is linear or curved, a groove and a hole.

It is also preferable to apply the diffusing agent composition to the surface of the semiconductor substrate and to thereafter rinse the surface of the semiconductor substrate with the organic solvent. After the formation of the coating film, the surface of the semiconductor substrate is rinsed, and thus it is possible to make the film thickness of the coating film more uniform. In particular, when the semiconductor substrate has a three-dimensional structure on its surface, the film thickness of the coating film is easily increased in a bottom portion (step portion) of the three-dimensional structure. However, after the formation of the coating film, the surface of the semiconductor substrate is rinsed, and thus it is possible to make the film thickness of the coating film uniform.

As the organic solvent used for rinsing, the above-described organic solvents in which the diffusing agent composition may be contained can be used.

[Pre-Diffusion Heating Processing Step]

In the pre-diffusion heating processing step, after the formation of the coating film until the start of the diffusion of the impurity diffusing component (A), heating processing is performed on the semiconductor substrate under the temperature condition lower than the diffusion temperature. The condition of the heating processing described above is preferably 450° C. or more and less than 700° C. for 5 seconds or more and 1 minute or less. The pre-diffusion heating processing is preferably performed at a constant temperature.

When the semiconductor substrate including the coating film is processed under the temperature condition lower than the diffusion temperature for the predetermined time, depending on the type of impurity diffusing component (A), it is likely that the sublimation of the impurity diffusing component (A) is reduced and that the diffusion properties (such as in-plane uniformity and a resistance value) of the impurity diffusing component (A) can be enhanced. The performance of the pre-diffusion heating processing step is effective particularly when the impurity diffusing component (A) is a boron compound. It can be considered that boron in the impurity diffusing component (A) is oxidized into borate glass and that thus boron is easily fixed as a film.

For example, the preferred temperature in the pre-diffusion heating processing is preferably 450° C. or more and less than 700° C., is more preferably 500° C. or more and 690° C. or less and is particularly preferably 500° C. or more and 670° C. or less.

In terms of a balance between the effect of enhancing the impurity diffusion property in the pre-diffusion heating processing step and the efficiency of manufacturing of the semiconductor substrate, the heating processing time in the pre-diffusion heating processing is preferably 5 seconds or more and 45 seconds or less and is more preferably 10 seconds or more and 30 seconds or less.

[Diffusion Step]

In the diffusion step, the impurity diffusing component (A) in the thin coating film which is formed of the diffusing agent composition on the semiconductor substrate is diffused into the semiconductor substrate. A method of diffusing the impurity diffusing component (A) into the semiconductor substrate is not particularly limited as long as a method of diffusing, by heating, the impurity diffusing component (A) from the coating film formed of the diffusing agent composition is adopted. In the specification of the present application, the "diffusion step" is assumed to be a step which is performed after the time when the predetermined diffusion temperature is reached until a diffusion time (holding time of the diffusion temperature) elapses.

As a typical method, a method of heating, in a heating furnace such as an electric furnace, the semiconductor substrate including the coating film formed of the diffusing agent composition is mentioned. In this case, a heating condition is not particularly limited as long as the impurity diffusing component (A) is diffused to a desired degree.

The heating for the diffusion of the impurity diffusing component (A) is performed, at a temperature which is preferably 700° C. or more and 1400° C. or less and is more preferably 700° C. or more and less than 1200° C., preferably for 1 second or more and 20 minutes or less and more preferably for 1 second or more and 1 minute or less.

When the semiconductor substrate can be rapidly increased at a temperature increase rate of 25° C./second or more to the predetermined diffusion temperature, the diffusion time (holding time of the diffusion temperature) may be 30 seconds or less, 10 seconds or less, 5 seconds or less, 3 seconds or less, 2 seconds or less or a very short time such as less than 1 second. The lower limit of the diffusion time is not particularly limited as long as the impurity diffusing component can be diffused to a desired degree. For example, the lower limit of the diffusion time may be 0.05 seconds or more, 0.1 seconds or more, 0.2 seconds or more, 0.3 seconds or more or 0.5 seconds or more. In this case, in a shallow region of the surface of the semiconductor substrate, the impurity diffusing component (A) is easily diffused at a high concentration.

In the diffusion step, an atmosphere around the semiconductor substrate when the semiconductor substrate is heated is preferably an atmosphere in which the concentration of oxygen is 1% by volume or less. The concentration of oxygen in the atmosphere is more preferably 0.5% by volume or less, is more preferably 0.3% by volume or less and is particularly preferably 0.1% by volume or less and most preferably, oxygen is not included. The concentration of oxygen in the atmosphere is adjusted to the desired concentration with arbitrary timing in the step preceding the diffusion step. A method of adjusting the concentration of oxygen is not particularly limited. As the method of adjusting the concentration of oxygen, a method of passing an inert gas such as nitrogen gas into a device for heating the semiconductor substrate and discharging oxygen within the device to the outside of the device together with the inert gas is mentioned. In this method, the time during which the inert gas is passed is adjusted, and thus it is possible to adjust the concentration of oxygen within the device. As the time during which the inert gas is passed is increased, the concentration of oxygen within the device is lowered. When the diffusion is performed in an atmosphere of a low oxygen concentration, it can be considered that silicon oxide formed by oxygen on the surface of the semiconductor substrate is unlikely to be formed. Consequently, the impurity diffusing component (A) is easily diffused into the substrate which is mainly formed of silicon, and thus the in-plane uniformity of diffusion of the impurity diffusing component (A) is enhanced.

After the diffusion step described above, on the surface of the semiconductor substrate into which the impurity diffusing component (A) is diffused and in the vicinity of the surface, a residue derived from the impurity diffusing component (A) may be adhered or a high-concentration layer which includes the impurity diffusing component at an extremely high concentration may be formed. The adherence of the residue and the formation of the high-concentration layer may adversely affect the function of a semiconductor device when the semiconductor device is manufactured with the semiconductor substrate obtained through the diffusion step. Hence, after the diffusion step, processing for removing the residue and the high-concentration layer is preferably performed.

As the preferred processing after the diffusion step, processing which brings a hydrofluoric acid (HF) aqueous solution into contact with the surface of the semiconductor substrate is mentioned. In the processing described above, the residue adhered to the surface of the semiconductor substrate can be removed. The concentration of the hydrofluoric acid aqueous solution is not particularly limited as long as the residue can be removed. For example, the concentration of the hydrofluoric acid aqueous solution is preferably 0.05% by mass or more and 5% by mass or less and is more preferably 0.1% by mass or more and 1% by mass or less. The temperature at which the hydrofluoric acid aqueous solution is brought into contact with the surface of the semiconductor substrate is not particularly limited as long as the residue can be removed. For example, the temperature at which the hydrofluoric acid aqueous solution is brought into contact with the surface of the semiconductor substrate is preferably 20° C. or more and 40° C. or less and is more preferably 23° C. or more and 30° C. or less. The time during which the hydrofluoric acid aqueous solution is brought into contact with the surface of the semiconductor substrate is not particularly limited as long as the residue can be removed and unacceptable damage is prevented from being produced in the semiconductor substrate. For example, the time during which the hydrofluoric acid aqueous solution is brought into contact with the surface of the semiconductor substrate is preferably 15 seconds or more and 5 minutes or less and is more preferably 30 seconds or more and 1 minute or less.

Before the processing which brings the hydrofluoric acid aqueous solution into contact, plasma ashing is preferably performed on the surface of the semiconductor substrate. In the processing described above, not only the reside but also the high-concentration layer formed on the surface of the semiconductor substrate or in the vicinity of the surface of the semiconductor substrate can be removed. As the plasma ashing, plasma ashing using an oxygen-containing gas is preferable, and oxygen plasma ashing is more preferable. As long as the object of the present invention is not inhibited, various gases which are conventionally used in plasma processing together with oxygen can be mixed with the gas which is used for generation of oxygen plasma. Examples of the gas described above include nitrogen gas, hydrogen gas and the like. The conditions of the plasma ashing are not particularly limited as long as the object of the present invention is not inhibited.

In the method described above, the diffusing agent composition is used, and thus it is easy to satisfactorily and uniformly diffuse the impurity diffusing component into the semiconductor substrate while forming the coating film which is thin and which is excellent in stability after being formed. Hence, the manufacturing method described above can be suitably applied not only to the manufacturing of a semiconductor substrate having a flat surface but also to the manufacturing of a semiconductor substrate used in the manufacturing of a multi-gate element having a minute three-dimensional structure. In particular, the method according to the present invention can be suitably applied to the manufacturing of a CMOS element for a CMOS image sensor and a semiconductor element such as a logic LSI device.

EXAMPLES

Although the present invention will be more specifically described below using Examples, the present invention is not limited to Examples below.

Examples 1 to 52 and Comparative Examples 2 to 18

In Examples 1 to 52 and Comparative Examples 2 to 18, as the impurity diffusing component (A) ((A) component), A1 to A5 below were used.
A1: boric acid
A2: boron trioxide
A3: tetrahydroxydiborane
A4: tri-n-butoxyboron
A5: trimethoxyboron In Examples 1 to 52, as the amine compound (B) ((B) component), B1 to B13 below were used.
B1: N, N'-di-tert-butylethylenediamine (NA: 0, NB: 2, NC: 0)
B2: N-(2-aminoethyl) ethanolamine (NA: 1, NB: 1, NC: 0)
B3: piperazine (hexahydrate) (NA: 0, NB: 2, NC: 0)
B4: triethylenetetramine (NA: 2, NB: 2, NC: 0)
B5: N, N'-bis (3-aminopropyl) ethylenediamine (NA: 2, NB: 2, NC: 0)
B6: N, N'-dimethylethylenediamine (NA: 0, NB: 2, NC: 0)
B7: N, N'-diisopropylethylenediamine (NA: 0, NB: 2, NC: 0)
B8: N, N'-dimethyl-1,3-propanediamine (NA: 0, NB: 2, NC: 0)
B9: diethylenetriamine (NA: 2, NB: 1, NC: 0)
B10: tetraethylenepentamine (NA: 2; NB: 3, NC: 0)
B11; N, N'-bis (3-aminopropyl) ethylenediamine (NA: 2, NB: 2, NC: 0)
B12: tris (2-aminoethyl) amine (NA: 3, NB: 0, NC: 1)
B13: N-(2-aminoethyl) piperazine (NA: 1, NB: 1, NC: 1)

In Comparative Examples 2 to 18, as the amine compound,
B'1 to B'6 below were used.
B'1: tert-butylamine (NA: 1, NB: 0, NC: 0)
B'2: diethylamine (NA: 0, NB: 1, NC: 0)
B'3: triethylamine (NA: 0, NB: 0, NC: 1)
B'4: imidazole
B'5: 1-methylimidazole
B'6: monoethanolamine (NA: 1, NB: 0, NC: 0)

In Examples 1 to 52 and Comparative Examples 2 to 18, as the organic solvent (S) ((S) component), S1 and S2 below were used.
S1: mixed solvent formed of 70% by mass of propylene glycol monomethyl ether acetate and 30% by mass of propylene glycol monomethyl ether
S2: propylene glycol monomethyl ether The types of impurity diffusing components (A) described in tables 1 to 4 and the types of amine compounds (B) described in tables 1 to 4 or amine compounds which did not correspond to the amine compounds (B) were dissolved in the types of organic solvents (S) described in tables 1 to 4 so as to respectively have concentrations described in tables 1 to 4, with the result that diffusing agent compositions in Examples and Comparative Examples were prepared. In Comparative Example 1, the amine compound was not used.

With a spin coater, the diffusing agent compositions each were applied to the surface of a silicon substrate (6 inches, n-type) including a flat surface so as to form coating films. As film formation conditions, the number of revolutions (rpm) of the spin coater, whether or not rinsing was performed with the organic solvent after the coating, whether or not baking was performed after the coating or after the rinsing and baking conditions were described in tables 1 to 4. In Example 7, after the coating using the spin coater, rinsing was performed with propylene glycol monomethyl ether. In Examples 28 and 31 and Comparative Examples 2, 4, 7, 10, 13 and 16, after the coating using the spin coater, rinsing was performed with propylene glycol monomethyl ether acetate. In Examples 45, 47, 49 and 51, after the coating using the spin coater, rinsing was performed with the organic solvent S1 described above.

For the coating films formed by the methods described above, the film thicknesses thereof were measured. In Examples 1 to 4, 6, 8 to 24, 26, 29, 33, 35 to 37 and 40 to 52 and Comparative Example 18, the stability of the coating films was evaluated by the following method. Specifically, after the formed coating films were left in an environment of a clean room (normal temperature and pressure) for 24 hours, the film thicknesses of the coating films were measured again, and the stability of the coating films was evaluated according to criteria below.
A: Film thickness of coating film after being left for 24 hours was 90% or more of film thickness of coating film immediately after being formed.
B: Film thickness of coating film after being left for 24 hours was 70% or more and less than 90% of film thickness of coating film immediately after being formed.
C: Film thickness of coating film after being left for 24 hours was less than 70% of film thickness of coating film immediately after being formed.

The results of the measurements of the film thicknesses and the results of the evaluations of the stability of the coating films are described in tables 1 to 4. In Comparative Examples 1 to 17, uniform coating films were not formed due to the generation of particles at the time of coating. Hence, in Comparative Examples 1 to 17, the measurements of the film thicknesses of the coating films and the evaluations of the stability of the coating films were not performed.

In part of Examples, after the formation of the coating films, diffusion processing on the impurity diffusing components was performed according to the following method. With a rapid thermal anneal device (lamp anneal device), under a nitrogen atmosphere at a flow rate of 1 L/m, at a temperature increase rate of 15° C./second, the semiconductor substrates including the coating films were heated to the temperatures described in tables 1 to 3. Then, the temperatures described in tables 1 to 3 were held for times described in tables 1 to 3, and the diffusion processing was performed. The starting point of the diffusion time was the time when the temperature of the substrate reached a predetermined diffusion temperature. After the completion of the diffusion, the semiconductor substrates were rapidly cooled to room temperature.

In any of Examples in which the diffusion processing was performed, after the diffusion processing, the semiconductor substrates were inverted from the n-type to the p-type. The results of measurements of sheet resistance values of the semiconductor substrates after the diffusion processing are described in tables 1 to 3.

TABLE 1

| | Diffusing agent composition | | | | | | Coating film | | Diffusion evaluation | | Sheet resistance value ($\Omega$/sq.) |
|---|---|---|---|---|---|---|---|---|---|---|---|
| | Component (A) Type/Concentration (Mass %) | Component (B) Type/Concentration (Mass %) | Component (S) Type | Film formation conditions | | | Film thickness (nm) | Stability | Diffusion conditions | | |
| | | | | rpm | Rinse | Bake | | | | | |
| Example 1 | A1/0.085 | B1/0.24 | S1 | 750 | Not done | Not done | 3.8 | B | 1000° C. 25 seconds | | 223.5 |
| Example 2 | | | | 750 | Not done | 100° C. One minute | 1.7 | B | — | | — |
| Example 3 | A1/0.085 | B2/0.24 | S1 | 750 | Not done | Not done | 17.1 | A | — | | — |
| Example 4 | | | | 750 | Not done | 100° C. One minute | 4.5 | B | 1000° C. 25 seconds | | 209.6 |
| Example 5 | A1/0.08 | B2/0.04 | S1 | 1000 | Not done | Not done | 3.5 | — | — | | — |
| Example 6 | | | | 1000 | Not done | 100° C. One minute | 2.7 | A | 1000° C. 25 seconds | | 352.0 |
| Example 7 | | | | 1000 | Done | 100° C. One minute | 1.7 | — | — | | — |
| Example 8 | A1/0.085 | B3/0.24 | S1 | 750 | Not done | Not done | 3.7 | B | 1000° C. 25 seconds | | 215.4 |
| Example 9 | A1/0.085 | B4/0.24 | S1 | 750 | Not done | Not done | 19.5 | A | — | | — |
| Example 10 | | | | 750 | Not done | 100° C. One minute | 4.6 | A | 1000° C. 25 seconds | | 159.8 |
| Example 11 | A1/0.08 | B4/0.04 | S1 | 1000 | Not done | Not done | 4.1 | A | — | | — |
| Example 12 | | | | 1000 | Not done | 100° C. One minute | 3.6 | A | 1000° C. 25 seconds | | 192.1 |
| Example 13 | A1/0.085 | B5/0.24 | S1 | 750 | Not done | Not done | 13.4 | A | — | | — |
| Example 14 | | | | 750 | Not done | 100° C. One minute | 5.4 | A | 1000° C. 25 seconds | | 159.3 |
| Example 15 | A1/0.08 | B5/0.04 | S1 | 1000 | Not done | Not done | 4.5 | A | — | | — |
| Example 16 | | | | 1000 | Not done | 100° C. One minute | 3.5 | A | 1000° C. 25 seconds | | 218.3 |
| Example 17 | A2/0.048 | B2/0.24 | S1 | 750 | Not done | Not done | 18 | A | 1000° C. 25 seconds | | 200.8 |
| Example 18 | | | | 750 | Not done | 100° C. One minute | 4.7 | A | 1000° C. 25 seconds | | 200.5 |
| Example 19 | A2/0.048 | B4/0.24 | S1 | 750 | Not done | Not done | 19.2 | A | — | | — |
| Example 20 | | | | 750 | Not done | 100° C. One minute | 4.5 | A | — | | — |

TABLE 2

| | Diffusing agent composition | | | | | | Coating film | | Diffusion evaluation | | Sheet resistance value ($\Omega$/sq.) |
|---|---|---|---|---|---|---|---|---|---|---|---|
| | Component (A) Type/Concentration (Mass %) | Component (B) Type/Concentration (Mass %) | Component (S) Type | Film formation conditions | | | Film thickness (nm) | Stability | Diffusion conditions | | |
| | | | | rpm | Rinse | Bake | | | | | |
| Example 21 | A2/0.045 | B4/0.04 | S1 | 1000 | Not done | Not done | 3.8 | A | — | | — |
| Example 22 | | | | 1000 | Not done | 100° C. One minute | 3.7 | B | 1000° C. 25 seconds | | 220.5 |
| Example 23 | A3/0.069 | B4/0.04 | S1 | 1000 | Not done | Not done | 3.6 | A | — | | — |
| Example 24 | | | | 1000 | Not done | 100° C. One minute | 3.5 | A | 1000° C. 25 seconds | | 204.8 |
| Example 25 | A1/0.085 | B1/0.12 | S1 | 300 | Not done | Not done | 6.1 | — | 1050° C. 10 seconds | | 189.8 |
| Example 26 | | | | 300 | Not done | 100° C. One minute | 4.1 | A | 1050° C. 10 seconds | | 243.3 |
| Example 27 | A1/0.085 | B1/0.24 | S1 | 300 | Not done | Not done | 6.2 | — | 1050° C. 10 seconds | | 158.1 |
| Example 28 | | | | 300 | Done | Not done | 4.5 | — | 1050° C. 10 seconds | | 179.0 |

TABLE 2-continued

| | Diffusing agent composition | | | | | | Coating film | | Diffusion evaluation | |
| --- | --- | --- | --- | --- | --- | --- | --- | --- | --- | --- |
| | Component (A) Type/ Concentration (Mass %) | Component (B) Type/ Concentration (Mass %) | Component (S) Type | Film formation conditions | | | Film thickness (nm) | Stability | Diffusion conditions | Sheet resistance value (Ω/sq.) |
| | | | | rpm | Rinse | Bake | | | | |
| Example 29 | | | | 300 | Not done | 100° C. One minute | 3.8 | A | 1050° C. 10 seconds | 247.0 |
| Example 30 | | | | 300 | Not done | Not done | 6.2 | — | 1050° C. 10 seconds | 168.8 |
| Example 31 | A1/0.085 | B6/0.12 | S1 | 300 | Done | Not done | 5.7 | — | — | — |
| Example 32 | | | | 300 | Not done | 100° C. One minute | 4.8 | — | — | — |
| Example 33 | | | | 750 | Not done | Not done | 3.7 | B | — | — |
| Example 34 | A1/0.085 | B7/0.20 | S1 | 750 | Not done | 100° C. One minute | 1.4 | — | — | — |
| Example 35 | | | | 300 | Not done | 100° C. One minute | 3.4 | B | 1000° C. 25 seconds | 183.5 |
| Example 36 | A1/0.085 | B8/0.14 | S1 | 750 | Not done | Not done | 3.7 | B | — | — |
| Example 37 | | | | 750 | Not done | 100° C. One minute | 3.0 | A | 1000° C. 25 seconds | 220.8 |
| Example 38 | A4/0.25 | B1/0.24 | S1 | 300 | Not done | Not done | 5.5 | — | 1050° C. 10 seconds | 268.1 |
| Example 39 | A5/0.11 | B1/0.24 | S1 | 300 | Not done | Not done | 5.1 | — | 1050° C. 10 seconds | 193.1 |

TABLE 3

| | Diffusing agent composition | | | | | | Coating film | | Diffusion evaluation | |
| --- | --- | --- | --- | --- | --- | --- | --- | --- | --- | --- |
| | Component (A) Type/ Concentration (Mass %) | Component (B) Type/ Concentration (Mass %) | Component (S) Type | Film formation conditions | | | Film thickness (nm) | Stability | Diffusion conditions | Sheet resistance value (Ω/sq.) |
| | | | | rpm | Rinse | Bake | | | | |
| Example 40 | A1/0.08 | B9/0.4 | S1 | 750 | Not done | Not done | 4.8 | B | — | — |
| Example 41 | | | | 750 | Not done | 100° C. One minute | 3.6 | A | 1000° C. 25 seconds | 189.2 |
| Example 42 | A1/0.08 | B10/0.4 | S1 | 750 | Not done | Not done | 4.8 | A | — | — |
| Example 43 | | | | 750 | Not done | 100° C. One minute | 4.1 | A | 1000° C. 25 seconds | 189.1 |
| Example 44 | A1/0.08 | B4/0.04 | S2 | 850 | Not done | Not done | 4.5 | A | — | — |
| Example 45 | | | | 850 | Done | 100° C. One minute | 2.3 | A | 1000° C. 25 seconds | 473.3 |
| Example 46 | A1/0.08 | B10/0.04 | S2 | 850 | Not done | Not done | 4.8 | B | — | — |
| Example 47 | | | | 850 | Done | 100° C. One minute | 2.9 | A | 1000° C. 25 seconds | 355.8 |
| Example 48 | A1/0.08 | B11/0.04 | S2 | 850 | Not done | Not done | 4.9 | A | — | — |
| Example 49 | | | | 850 | Done | 100° C. One minute | 2.7 | A | 1000° C. 25 seconds | 302.6 |
| Example 50 | A1/0.08 | B12/0.04 | S2 | 850 | Not done | Not done | 4.7 | B | — | — |
| Example 51 | | | | 850 | Done | 100° C. One minute | 3.3 | A | 1000° C. 25 seconds | 215.8 |
| Example 52 | A1/0.085 | B13/0.04 | S1 | 750 | Not done | Not done | 3.8 | B | — | — |

TABLE 4

| | Diffusing agent composition | | | | | | Coating film | | Diffusion evaluation | |
|---|---|---|---|---|---|---|---|---|---|---|
| | Component (A) Type/ Concentration (Mass %) | Amine compound Type/ Concentration (Mass %) | Component (S) Type | Film formation conditions | | | Film thickness (nm) | Stability | Diffusion conditions | Sheet resistance value (Ω/sq.) |
| | | | | rpm | Rinse | Bake | | | | |
| Comparative Example1 | A1/0.085 | | S1 | 300 | Not done | Not done | — | — | — | — |
| Comparative Example2 | | | | 300 | Done | Not done | — | — | — | — |
| Comparative Example3 | | | | 300 | Not done | Not done | — | — | — | — |
| Comparative Example4 | A1/0.085 | B'1/0.1 | S1 | 300 | Done | Not done | — | — | — | — |
| Comparative Example5 | | | | 300 | Not done | 100° C. One minute | — | — | — | — |
| Comparative Example6 | | | | 300 | Not done | Not done | — | — | — | — |
| Comparative Example7 | A1/0.085 | B'2/0.1 | S1 | 300 | Done | Not done | — | — | — | — |
| Comparative Example8 | | | | 300 | Not done | 100° C. One minute | — | — | — | — |
| Comparative Example 9 | | | | 300 | Not done | Not done | — | — | — | — |
| Comparative Example10 | A1/0.085 | B'3/0.14 | S1 | 300 | Done | Not done | — | — | — | — |
| Comparative Example11 | | | | 300 | Not done | 100° C. One minute | — | — | — | — |
| Comparative Example12 | | | | 300 | Not done | Not done | — | — | — | — |
| Comparative Example13 | A1/0.085 | B'4/0.094 | S1 | 300 | Done | Not done | — | — | — | — |
| Comparative Example14 | | | | 300 | Not done | 100° C. One minute | — | — | — | — |
| Comparative Example15 | | | | 300 | Not done | Not done | — | — | — | — |
| Comparative Example16 | A1/0.085 | B'5/0.11 | S1 | 300 | Done | Not done | — | — | — | — |
| Comparative Example17 | | | | 300 | Not done | 100° C. One minute | — | — | — | — |
| Comparative Example18 | A1/0.085 | B'6/0.04 | S1 | 750 | Not done | Not done | 2.9 | C | — | — |

It is found from tables 1 to 3 that when the diffusing agent compositions including the impurity diffusing components (A) and the amine compounds (B) satisfying the predetermined conditions are used, it is possible to easily form coating films which are thin and which are excellent in stability after being formed. It is also found that when the diffusing agent compositions including only the impurity diffusing components (A) or the diffusing agent compositions including the impurity diffusing components (A) and the amine compounds which do not satisfy the predetermined conditions are used, it is impossible to form uniform coating films in the first place or it is difficult to form coating films which are excellent in stability.

Example 53

The diffusing agent composition of Example 28 was applied on a silicon substrate having a trench pattern on its surface under the same conditions as in Example 28, and thereafter the diffusion processing was performed under the same conditions as in Example 28. In the trench pattern, the width of a trench (groove) was 450 nm, the depth of the trench was 4500 nm and the distance between the trenches was 1800 nm. When the semiconductor substrate after the diffusion processing was observed by scanning spreading resistance microscopy (SSRM), emitted light which followed the shape of the surface of the trench pattern and which had a uniform thickness was confirmed. Thus, it is found that a uniform coating film was formed on the surface of the trench pattern.

Examples 54 to 78

In Examples 54 to 78, as the impurity diffusing component (A) ((A) component), A6 to A9 below were used.
A6: trimethyl phosphate
A7: tris phosphate (trimethylsilyl)
A8: diphosphorus pentoxide
A9: tri-n-butoxyarsenic In Examples 54 to 78, as the amine compound (B) ((B) component), B1, B2, B3, B4 and B11 described above were used.

In Examples 54 to 78, as the organic solvent (S) ((S) component), S1 and S2 described above were used.

Coating films were formed in the same manner as in Examples 1 to 52 except that the silicon substrate (6 inches, n-type) was changed to a silicon substrate (6 inches, p-type). The film thicknesses of the coating films which were formed are described in table 5.

TABLE 5

| | Diffusing agent composition | | | | | |
|---|---|---|---|---|---|---|
| | Component (A) Type/ Concentration (Mass %) | Component (B) Type/ Concentration (Mass %) | Component (S) Type | Film formation conditions | | Coating film Film thickness (nm) |
| | | | | rpm | Rinse | Bake | |
| Example 54 | A6/0.1 | B1/0.24 | S1 | 750 | Not done | Not done | 0.7 |
| Example 55 | A6/0.1 | B2/0.24 | S1 | 750 | Not done | Not done | 15.4 |
| Example 56 | | | | 1000 | Not done | Not done | 13.6 |
| Example 57 | A6/0.1 | B4/0.24 | S1 | 750 | Not done | Not done | 21.3 |
| Example 58 | | | | 1000 | Not done | Not done | 18.6 |
| Example 59 | A6/0.1 | B3/0.24 | S1 | 750 | Not done | Not done | 1.4 |
| Example 60 | A6/0.1 | B11/0.24 | S1 | 750 | Not done | Not done | 23.7 |
| Example 61 | | | | 1000 | Not done | Not done | 20.9 |
| Example 62 | A6/0.1 | B4/0.05 | S2 | 850 | Not done | Not done | 4.3 |
| Example 63 | | | | 850 | Not done | 100° C. One minute | 1.1 |
| Example 64 | A7/0.1 | B4/0.05 | S2 | 850 | Not done | Not done | 3.9 |
| Example 65 | | | | 850 | Not done | 100° C. One minute | 3.3 |
| Example 66 | A8/0.1 | B4/0.05 | S2 | 850 | Not done | Not done | 9.0 |
| Example 67 | | | | 850 | Not done | 100° C. One minute | 8.7 |
| Example 68 | | | | 1000 | Not done | 100° C. One minute | 8.0 |
| Example 69 | A8/0.5 | B4/0.025 | S2 | 850 | Not done | Not done | 4.8 |
| Example 70 | | | | 850 | Not done | 100° C. One minute | 4.6 |
| Example 71 | | | | 850 | Not done | 100° C. One minute | 3.9 |
| Example 72 | | | | 850 | Not done | 100° C. One minute | 4.6 |
| Example 73 | | | | 850 | Not done | Not done | 6.9 |
| Example 74 | A8/0.5 | B4/0.05 | S2 | 850 | Not done | 100° C. One minute | 4.6 |
| Example 75 | | | | 850 | Not done | 100° C. One minute | 4.4 |
| Example 76 | | | | 850 | Not done | Not done | 4.1 |
| Example 77 | A9/0.08 | B4/0.04 | S2 | 850 | Not done | 100° C. One minute | 1.5 |
| Example 78 | | | | 850 | Not done | Not done | 3.5 |

In Examples 54 to 78, the stability of the coating films was checked in the same manner as in Examples 1 to 52, and all the results of the evaluations were satisfactory. In part of Examples 54 to 78, the diffusion processing was performed at a diffusion temperature of 1000° C. for a diffusion time of 25 seconds in the same manner as in Examples 1 to 52, and a satisfactory diffusion property was confirmed.

What is claimed is:

1. A diffusing agent composition used for diffusion of an impurity into a semiconductor substrate, the diffusing agent composition comprising:
    an impurity diffusing component (A) and an amine compound (B), wherein the diffusing agent composition does not comprise a resin, wherein the amine compound (B) is an aliphatic amine, wherein when a number of primary amino groups included in the amine compound (B) is NA, a number of secondary amino groups included in the amine compound (B) is NB and a number of tertiary amino groups included in the amine compound (B) is NC, NA, NB and NC satisfy formulas (1) and (2) below:

(NB+NC)≥1     (1)

(NA+NB+NC)≥2     (2); and wherein when NB+NC<NA, in the amine compound (B), the primary amino groups are bound to an aliphatic hydrocarbon group having 2 or less carbon atoms.

2. The diffusing agent composition according to claim 1, wherein the amine compound (B) is a linear or branched aliphatic amine compound.

3. The diffusing agent composition according to claim 1, wherein the impurity diffusing component (A) comprises at least one selected from a group consisting of a boron compound, a phosphorus compound and an arsenic compound.

4. The diffusing agent composition according to claim 1, further comprising an organic solvent (S).

5. The diffusing agent composition according to claim 1, wherein the diffusing agent composition does not comprise water.

6. The diffusing agent composition according to claim 1, wherein the diffusing agent composition does not comprise a viscosity adjuster.

7. The diffusing agent composition according to claim 1, wherein the amine compound (B) is a linear or branched aliphatic amine or an aliphatic amine having a cyclic skeleton, and
    the linear aliphatic amine is an amine compound represented by the following formula (B1):

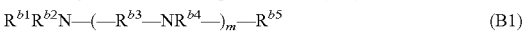
(B1)

wherein $R^{b1}$, $R^{b2}$, and $R^{b4}$ each independently represent a hydrogen atom, an alkyl group having 1 or more and 6 or less carbon atoms or a hydroxyalkyl group having 1 or more and 6 or less carbon atoms;

$R^{b5}$ represents an alkyl group having 1 or more and 6 or less carbon atoms, or a hydroxyalkyl group having 1 or more and 6 or less carbon atoms;

$R^{b3}$ represents an alkylene group having 1 or more and 6 or less carbon atoms;

m represents an integer of 2 or more and 5 or less;

a plurality of $R^{b3}$s may be identical or different, and a plurality of $R^{b4}$s may be identical or different;

in formula (B1), any two groups selected from a group consisting of $R^{b1}$, $R^{b2}$, $R^{b4}$ and $R^{b5}$ may be bound to form a ring; and the amine compound represented by formula (B1) may include two rings.

8. The diffusion composition according to claim 1, wherein the content of the amine compound (B) in the diffusion composition is 0.01% by mass or more and 20% by mass or less.

9. A method of manufacturing a semiconductor substrate, the method comprising:

forming a coating film by applying the diffusing agent composition according to claim 1 on the semiconductor substrate; and diffusing the impurity diffusing component (A) in the diffusing agent composition into the semiconductor substrate.

10. The method of manufacturing a semiconductor substrate according to claim 9, wherein the coating film is heated at a temperature of 700° C. or more and less than 1200° C. whereby the impurity diffusing component (A) is diffused into the semiconductor substrate.

11. The method of manufacturing a semiconductor substrate according to claim 9, wherein a film thickness of the coating film is 0.5 nm or more and 30 nm or less.

12. The method of manufacturing a semiconductor substrate according to claim 9, wherein the method further comprises rinsing the coating film with an organic solvent.

13. The method of manufacturing a semiconductor substrate according to claim 9, wherein the semiconductor substrate has, on a surface on which the diffusing agent composition is applied, a three-dimensional structure including a convex portion and a concave portion.

* * * * *